United States Patent [19]
Yoshida

[11] Patent Number: 5,003,565
[45] Date of Patent: Mar. 26, 1991

[54] CHARGE SKIMMING SOLID-STATE IMAGE ARRAY CIRCUIT AND METHOD INCLUDING INDIVIDUAL PHOTOSENSOR COMPENSATION

[75] Inventor: Yasuaki Yoshida, Itami, Japan

[73] Assignee: Mitsubishi Denki Kabushiki Kaisha, Japan

[21] Appl. No.: 439,325

[22] Filed: Nov. 21, 1989

[30] Foreign Application Priority Data

Dec. 1, 1988 [JP] Japan .................................. 63-305280

[51] Int. Cl.$^5$ ...................... G11C 19/28; H01L 29/78; H01L 27/14; H03K 3/42
[52] U.S. Cl. ........................................ 377/60; 357/24; 357/30; 307/311
[58] Field of Search ................... 357/24, 30; 307/311; 377/57–63

[56] References Cited

U.S. PATENT DOCUMENTS

| | | | |
|---|---|---|---|
| 3,845,295 | 10/1974 | Williams et al. | 357/24 LR |
| 3,856,989 | 12/1974 | Weimer | 357/24 LR |
| 3,969,634 | 7/1976 | Su et al. | 357/24 LR |
| 4,197,553 | 4/1980 | Finnila et al. | 357/30 |
| 4,213,137 | 7/1980 | Pines | 357/30 |
| 4,585,934 | 4/1986 | French et al. | 357/24 LR |
| 4,801,991 | 1/1989 | Hisa | 357/30 |
| 4,819,072 | 4/1989 | Boucharlat et al. | 357/24 LR |

OTHER PUBLICATIONS

Kimata et al., "High Density ... Image Sensor", SPIE, vol. 930, 1988, pp. 11–25.
Tanikawa et al., "A HgCdTe ... Thermal Band", Transducers, 1987, pp. 496–499.
"Hybrid Infrared Focal-Plane Arrays", Chow et al., IEEE Transactions on Electron Devices, vol. ED-29, No. 1, Jan. 1982.

Primary Examiner—Gene M. Munson
Attorney, Agent, or Firm—Leydig, Voit & Mayer

[57] ABSTRACT

A solid state imaging array for generating a plurality of electrical imaging signals includes photodiodes for producing electrical charges in response to incident light, a signal processing circuit including a charge skimming electrode associated with each sensor for receiving and storing electrical charges from the associated sensor and for transferring a skimmed portion of the stored electrical charge to a respective charge coupled device. The skimmed portion of the electrical charge is determined by the magnitude of a skimming voltage applied to the respective skimming electrode. The array includes a second charge coupled device for applying different magnitude skimming voltages to each of the skimming electrodes in order to compensate for variations in the sensitivities of the photodiodes. The individual compensation is achieved for all of the photodiodes through only two external terminals.

21 Claims, 7 Drawing Sheets

(PRIOR ART)

FIG 5(a) FIG 5(b)

(PRIOR ART)

CHARGE SKIMMING SOLID-STATE IMAGE ARRAY CIRCUIT AND METHOD INCLUDING INDIVIDUAL PHOTOSENSOR COMPENSATION

FIELD OF THE INVENTION

The present invention relates to a solid state imaging array, particularly for generating electrical imaging signals for forming a two-dimensional image of a source emitting light, apparatus for producing images employing the imaging array, and a method of calibrating and operating the array and apparatus. The invention particularly concerns compensation for varying sensitivities to light of the sensors employed in the array and imaging of sources emitting infrared light.

BACKGROUND OF THE INVENTION

Figure 8:
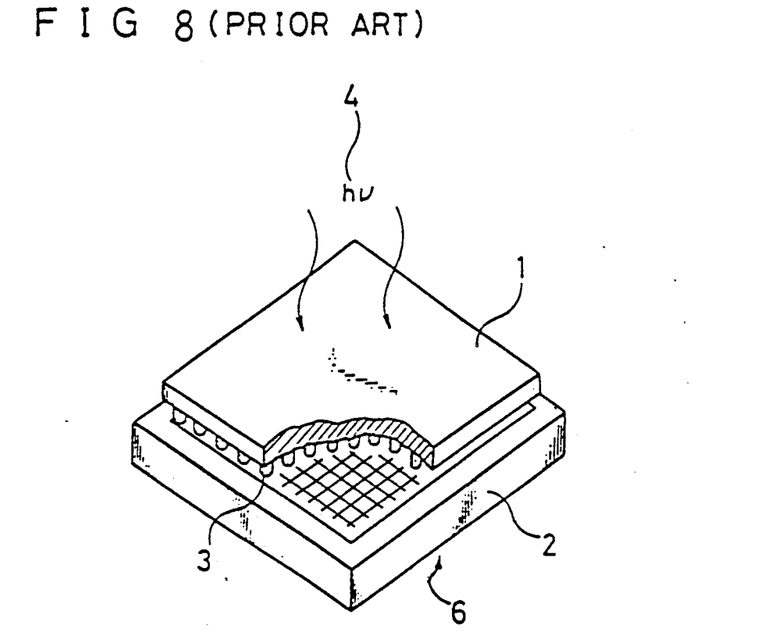
FIG. 8 is a perspective view, partially broken away, of an imaging array according to the prior art.

A two-dimensional imaging array is shown in a perspective view in FIG. 8. The array includes a two-dimensional array of photodiodes 1, for example, 128×128 photodiodes, for generating electrical signals in response to light incident on the respective photodiodes. The electrical signals generated comprise an electrical representation of the distribution of the incident light over a two-dimensional area. That distribution of light, to the extent it is radiated by a source, is referred to here as the image. The photodiode array is mounted on and electrically connected to a silicon substrate 2 containing signal processing circuitry. Each photodiode is in electrical communication with a respective signal processing circuit in the substrate 2 through a columnar body 3, such as a cylindrical volume of indium. This construction is particularly applicable to an infrared light detector in which incident infrared rays 4 strike the photodiode array 1. In that application, the photodiodes may be made of a semiconductor material, such as cadmium mercury telluride ($Cd_xHg_{1-x}Te$), that, unlike silicon, responds to infrared light by generating electrical charges. An infrared-sensitive array like that of FIG. 8 is described in U. S. Pat. No. 4,801,991. Together, the photodiode array 1, the silicon substrate 2 containing signal processing circuitry, and the columnar connectors 3 comprise an imaging array 6.

Figure 9:
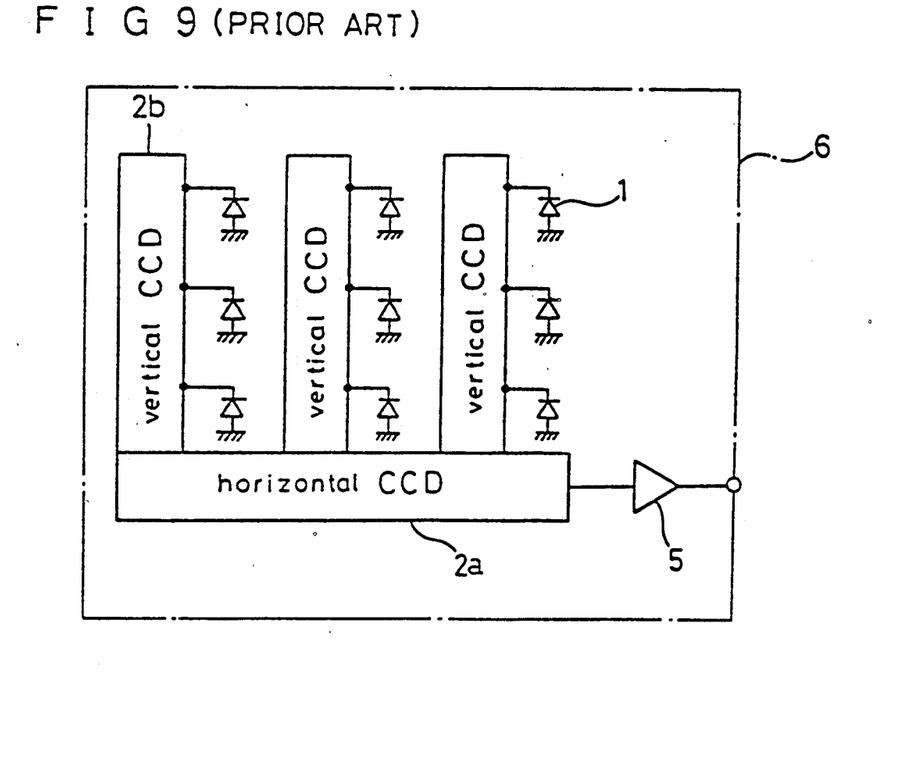
FIG. 9 is a schematic diagram of an imaging array according to the prior art.

The general electrical arrangement of the imaging array 6 is shown schematically in FIG. 9 for a 3×3 array of photodiodes. The signal processing circuitry in the substrate 2 includes a charge coupled device (CCD) including, in the embodiment of FIG. 9, a horizontal CCD 2a to which three vertical CCDs 2b are connected. The orientation of these CCDs is referred to here as horizontal and vertical because of the orientation of FIG. 9 and other figures. However, no limitation is implied by describing the CCDs as horizontal and vertical. These orientational terms are used only for convenience and refer to two groups of generally orthogonal CCDs in which a plurality of CCDs oriented along one direction are interconnected to a single CCD that is generally orthogonal to the interconnected CCDs. As shown in FIG. 9, each photodiode 1 supplies electrical charges to one of the vertical CCDs 2b through which those charges are transferred to the horizontal CCD 2a. The collected charges are further transferred by the horizontal CCD 2a to an external device through an output circuit element 5, indicated as an amplifier in the figures.

Figure 10:
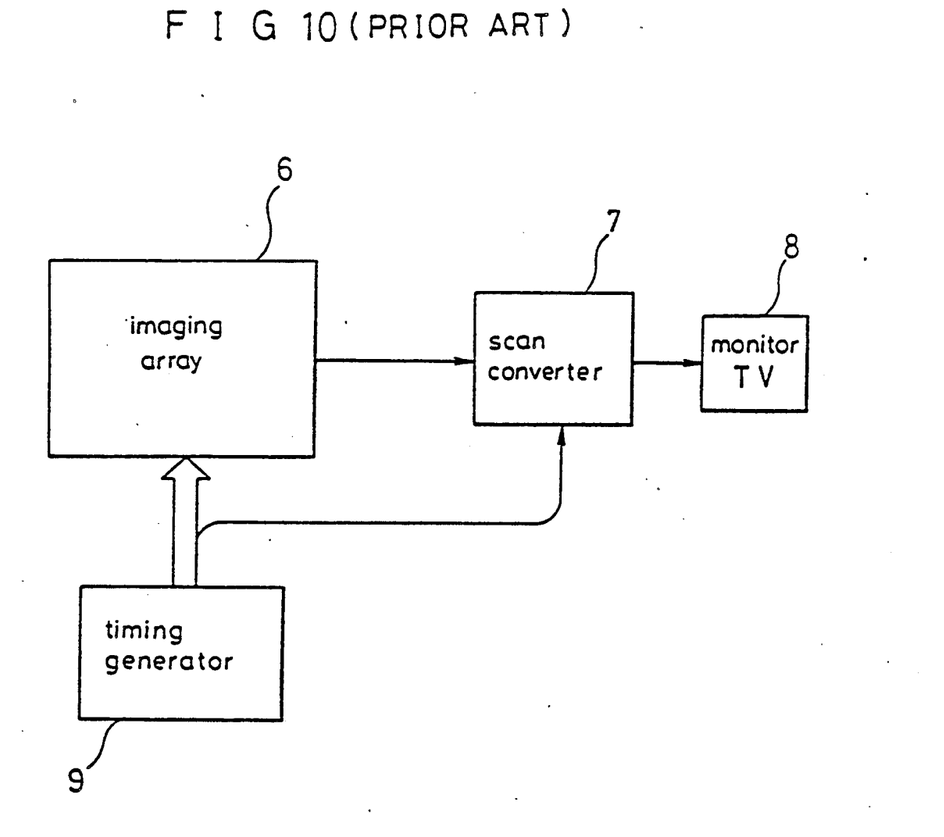
FIG. 10 is a schematic diagram of an imaging apparatus according to the prior art.

In FIG. 10, the imaging array 6 is interconnected with other components in an imaging apparatus. The imaging array provides electrical imaging signals, each signal representing the intensity of incident light at one of the locations of a photodiode array in a prearranged sequence related to photodiode locations, to a scan converter 7. The scan converter 7 uses the sequential electrical imaging signals to reconstruct a two-dimensional image which is displayed on a television monitor 8. To coordinate the reading out of the sequential electrical imaging signals from the array 6 with the conversion of those signals into a two-dimensional image in the scan converter 7, a timing generator 9 provides timing signals to both the array 6 and the scan converter 7.

Referring to FIGS. 8, 9, and 10, incident light causes the photodiodes 1 to produce electrical charges that are conducted through the connectors 3 to the respective signal processing circuits in the substrate 2. That signal processing circuit stores the electrical charges and eventually transfers them in a timed sequence through the vertical CCDs 2b to the horizontal CCD 2a. The horizontal CCD 2a further transfers the stored electrical charges in a timed sequence through the output circuit 5 to the scan converter 7. The signals are prepared by the scan converter 7 to meet the specifications, e.g., length and number of lines, scanning rate, and so on, of the monitor 8 and are subsequently displayed on the monitor as an image.

The structure of the array 6 shown in FIG. 8 is particularly useful in an infrared detector where the photodiode array is made of a different material from the silicon substrate 2. In the detection of infrared light having wavelengths of about 10 microns, for example, the photodiodes may employ $Cd_{0.2}Hg_{0.8}Te$. As understood in the art, the most difficult problem in detecting 10 micron band infrared images is the presence of significant amounts of background radiation. The background radiation is essentially noise that reduces image contrast. The technique commonly employed in other photodetectors to improve signal contrast, i.e., lengthening the time during which the signal charges are collected, is not successful in a photodetector responding to the 10 micron infrared band. Longer charge collection times only increase the quantity of charges generated by the background radiation, resulting in no signal-to-noise improvements.

Figure 7:
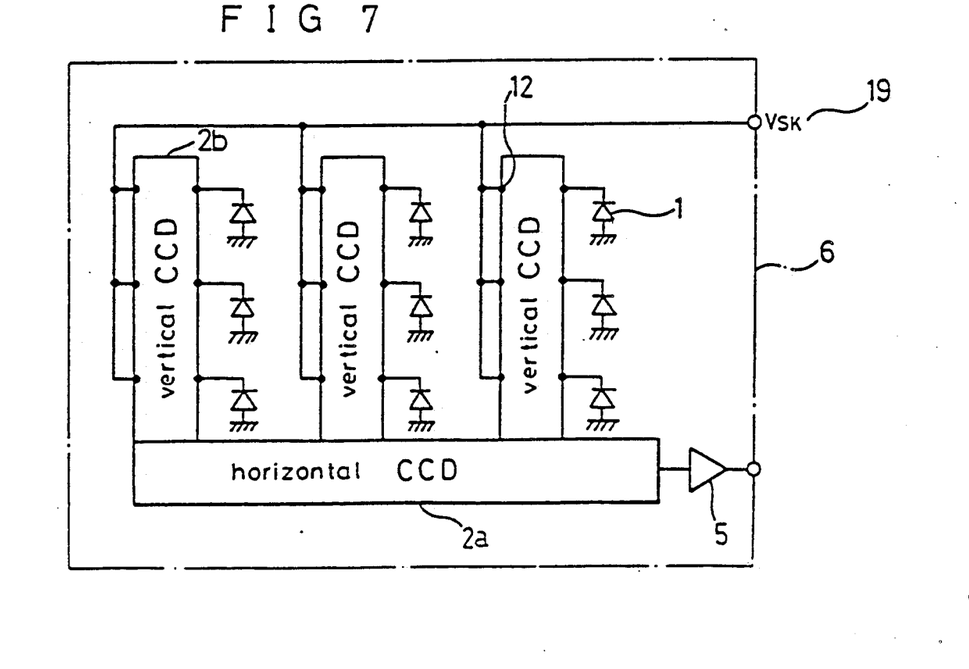
FIG. 7 is a schematic diagram of an imaging array not in accordance with the present invention.
Figures 11A, 11B, 11C:
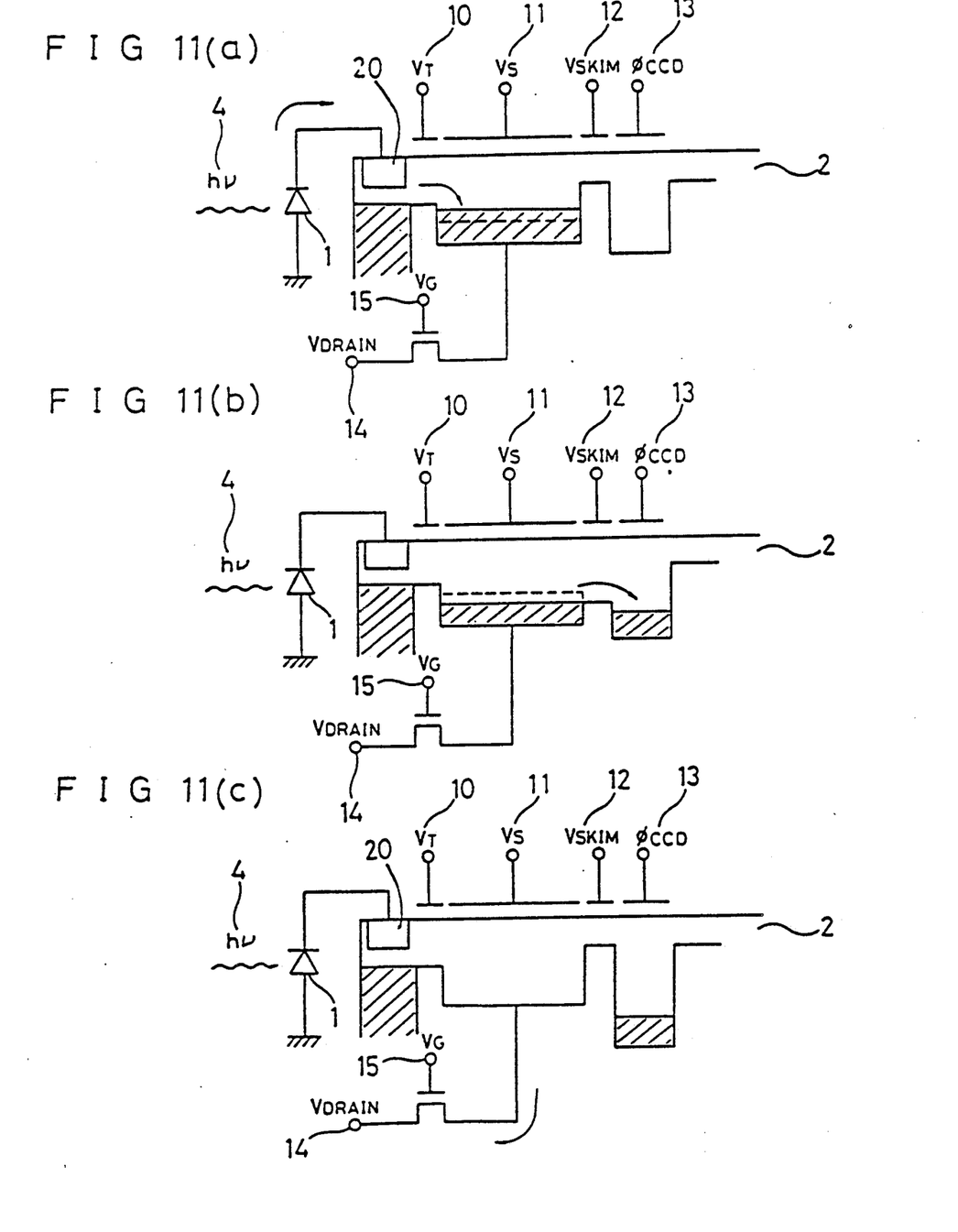
FIGS. 11(a), 11(b), and 11(c) are schematic diagrams illustrating the charge skimming technique.

The effects of the background radiation may be reduced by the charge skimming technique described by Chow et al in *IEEE Transactions On Electron Devices*, Volume ED-29, Number 1, January 1982, pages 3–13. Here, FIGS. 11(a)–11(c) schematically illustrate signal processing circuitry of the type incorporated in the substrate 2 and employing the charge skimming method. When that charge skimming method is employed, an additional skimming terminal 19, also designated $V_{SK}$, is connected to the signal processing circuitry as schematically shown in FIG. 7. The circuitry of FIG. 7 is analogous to that of FIG. 9 but includes an additional connection from each of the signal processing circuits associated with the respective photodiodes 1 to the terminal 19.

Turning to FIG. 11(a), the photodiode 1 generates electrical charge in response to incident light 4. That charge flows into the signal processing circuitry at a contact 20 in the substrate 2. The inflowing charge creates a mirror charge region, i.e., the signal charge, in the substrate 2 indicated by the hatched area opposite the contact 20 in FIG. 11(a). Those signal charges are further transferred from opposite the contact 20 to a potential well where they are stored. Charge transfer to the storage well is controlled by the magnitude of the voltage that is applied to a gate electrode 10. The storage well is created opposite a storage electrode 11 in response to a voltage applied to that electrode. Upon creation of the storage well and sufficient reduction of the barrier between it and the signal charge accumulation opposite the contact 20 by the application of a gate voltage to the gate electrode 10, the signal charges are transferred to and stored in the storage well. This charge transfer operation is illustrated in FIG. 11(a).

As illustrated in FIG. 11(b), a portion of the charge stored in the storage well is transferred to another potential well created opposite a CCD electrode 13. The transfer takes place upon the lowering of the potential barrier between the storage and CCD wells. That barrier is lowered by the application of a skimming voltage to the skimming electrode 12. As shown by the broken line in FIG. 10(b), depending upon the magnitude of the skimming voltage, only an uppermost portion of the charge stored in the storage well has sufficient energy to flow over the lowered barrier and into the CCD well. Thus, the stored charge is "skimmed" in response to the voltage applied to the skimming electrode 12.

After the skimming transfer, the potential barrier between the storage and CCD wells is restored. The remaining charge in the storage well is no longer needed and is drained through a drain electrode 14 of a field effect transistor (FET) by the application of a voltage to the gate electrode 15 of the FET. This drainage of the unneeded stored charge is illustrated in FIG. 10(c). There, the charge stored opposite the CCD electrode 13 is also illustrated.

Figure 6A:
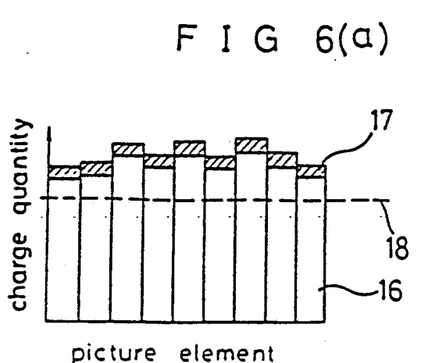
Figure 6B:
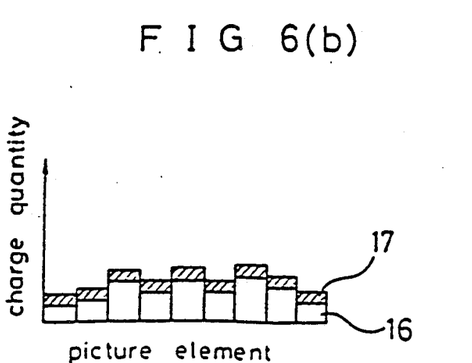

Through charge skimming, signal charges produced by the respective photodiodes 1 in response to background radiation, i.e., a direct current component, are discarded. The removal of this noise component, which improves the contrast of the image that may be produced, is illustrated in FIGS. 6(a) and 6(b). In FIG. 6(a), the quantity of charge produced by each of a number of picture elements in the array, i.e., the photodiode and signal processing circuitry, is plotted. The white area 16 for each array element represents the charges produced in response to background, i.e., non-image, incident light. The hatched area 17 for each array element represents the charges produced in response to the incident image radiation. The broken line 18 indicates a charge skimming level such that charges below line 18 are discarded through the drain terminal 14 of FIG. 11(c). The charges above line 18 are retained to produce the charge quantity as a function of array element shown in FIG. 6(b). Comparison of FIGS. 6(a) and 6(b) shows that the desired image charges after skimming represent a much larger proportion of the total charge than without the application of the skimming technique. In other words, skimming improves the signal-to-noise ratio.

The illustration of the charge skimming technique shown in FIGS. 6(a) and 6(b) assumes that the same charge skimming level is applied to each of the array elements. That result is conveniently achieved by the circuitry of FIG. 7 where each of the skimming electrodes 12 is electrically connected to the skimming terminal 19. Use of a uniform skimming level in the charge skimming technique provides satisfactory performance when each of the photodiodes in the array has substantially the same light response characteristics. As a result, the prior art teaches that uniformity in the sensitivity of each photodiode in an array is an important goal. However, it is frequently difficult or impossible to achieve uniform photosensitivity among the photodiodes. For example, some semiconductor materials, such as $Cd_xHg_{1-x}Te$ used in photodiodes sensitive to infrared light, have characteristics that are notoriously difficult to control, making the achievement of uniform sensitivities among many photodiodes virtually impossible. When the photosensitivities of the photoresponsive elements vary significantly within the array, the advantages of the conventional charge skimming technique with conventional sensors are partially or totally lost.

Figure 5A:
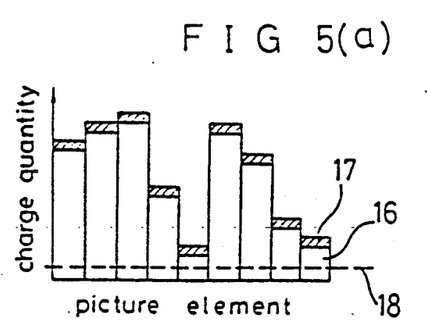
FIGS. 5(a), 5(b), 6(a), and 6(b) illustrate the effect of the charge skimming technique as employed in the prior art.
Figure 5B:
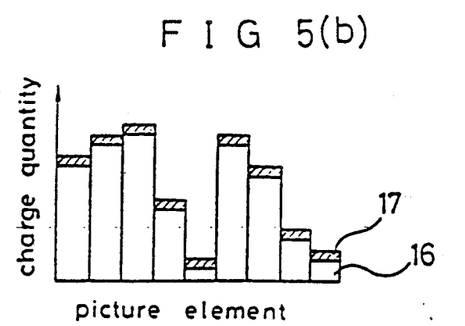

An example of significant variations in photodiode response within an array is illustrated in FIG. 5(a). There it can be seen that the area 16 corresponding to the background charges varies significantly amongst array elements. In order not to lose signal charges, the skimming level 18 has to be less than the background response of the least sensitive element in the array. As a result, the skimmed charges illustrated in FIG. 5(b) provide little improvement in discarding the background radiation compared to the response of FIG. 5(a).

Figure 4A:
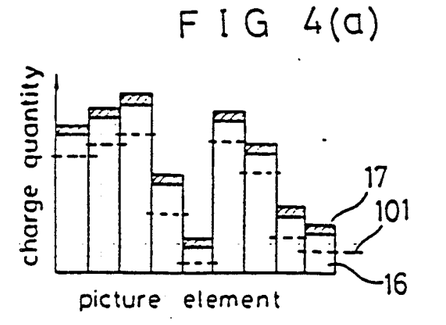
FIGS. 4(a) and 4(b) are diagrams illustrating the charge skimming technique according to the present invention.
Figure 4B:
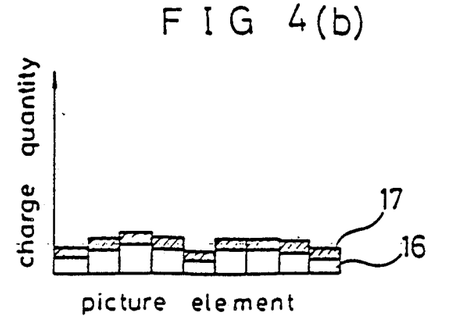

A proposed solution, teaching away from the prior art and according to one aspect of the present invention, for applying the charge skimming technique to a photoresponsive array in which the light sensors have widely varying sensitivities is the application of different skimming levels to the respective signal processing circuits. In that novel technique, the skimming levels are chosen to compensate for the sensitivities of the associated photodiodes. Application of different skimming levels to different array elements is illustrated in FIGS. 4(a) and 4(b). In FIG. 4(a), the background charge quantity 16 produced by each array element and the corresponding signal charge 17 produced by each element is illustrated as in FIGS. 5(a) and 6(a). Rather than applying a single skimming level 18 to each of the photodiodes, a skimming level 101 that may be different for each array element is applied to the respective photodiodes. The resulting skimmed signal is illustrated in FIG. 4(b). As can be seen by a comparison of FIGS. 4(b) and 5(b), the desired improvement in signal-to-noise ratio, i.e., contrast, achieved in FIG. 6(b) is also achieved in FIG. 4(b).

An imaging array for applying variable magnitude skimming levels directly to respective signal processing circuitry could include a separate skimming electrode terminal for each of the signal processing circuits. In a 128×128 photodiode array, however, that arrangement would require more than 16,000 terminals. An imaging array with such a large number of terminals is extremely difficult, if not impossible, to realize practically, particularly in arrays including enough photodiodes to provide a useful image.

SUMMARY OF THE INVENTION

It is an object of the present invention to provide a solid state imaging array, apparatus, and method of imaging in which charge skimming may be carried out with different skimming levels applied to respective photosensors to compensate for variations in the photoresponses of the respective photodiodes in the array.

A solid state imaging array according to the invention includes a plurality of photoresponsive sensors for producing electrical charges in response to incident light, a signal processing circuit including a charge skimming electrode associated with each sensor for receiving and storing electrical charges from the associated sensor and for transferring to a respective charge coupled device a skimmed portion of the stored electrical charges, the skimmed portion being determined by the magnitude of a skimming voltage applied to the respective skimming electrode, a plurality of first charge coupled devices for receiving the skimmed portion of the electrical charges from the signal processing circuit and for transferring the skimmed portion to external circuitry, and means for applying different magnitude skimming voltages to each of the skimming electrodes, thereby compensating for variations in the photosensitivities of the individual sensor. In a particular embodiment, the means for applying different skimming voltages includes a switching means associated with each of the signal processing circuits for converting skimming signals into skimming voltage magnitudes and for controlling the application of skimming voltage magnitudes to the respective skimming electrodes and a plurality of second charge coupled devices for simultaneously supplying the skimming signals to the respective switching means.

A solid state imaging apparatus according to the invention includes, in combination with the array, a memory for storing skimming levels corresponding to the magnitudes of the skimming voltages to be applied to the skimming electrodes and means for converting the stored skimming levels into skimming voltage magnitudes for applying those skimming voltages to the respective skimming electrodes. A preferred embodiment in which the skimming levels are stored in digital form includes a digital-to-analog converter for converting the stored levels into skimming signals for application to the respective signal processing circuits. The apparatus may include an analog-to-digital converter for receiving electrical charges transferred from the charge coupled devices while a uniform voltage is applied to the skimming electrodes under controlled illumination and for converting the quantities of charges received into digital values, establishing the skimming levels for storage in the memory.

An array of photosensors for forming an image is calibrated, according to the invention, by illuminating each of the photoresponsive sensors in the array with a controlled quantity of light, transferring the electrical charges produced by the respective sensors to produce correction signals establishing the relative photosensitivities of sensors for correcting the quantities of electrical charges produced by the respective sensors in response to light from an image and background light and thereby to compensate for variations in the photosensitivities of the individual sensors. The calibration method is applied to a solid state imaging array having a structure according to one aspect of the invention by applying a uniform magnitude voltage to each of the skimming electrodes in the array and transferring the electrical charges produced by the signal processing circuits for establishing the skimming levels required to compensate for the respective photosensitivities of the sensors. In calibrating the array, according to the invention, the controlled light may be of uniform intensity over the array or may vary in intensity over the array in correspondence with the background illumination incident on the array when no light from a desired image is present. A desired image is formed by calibrating an array of photosensors for forming an image, generating electrical charges in response to the incident light from the image and background, and correcting the electrical charges generated by the respective sensors with the correction signals produced in the calibration step. In a solid state imaging array having a structure according to the invention, the desired image is formed, after calibrating the array, by applying the respective magnitudes of skimming voltages to the corresponding skimming electrodes and transferring the skimmed electrical charges to charge coupled devices for producing electrical imaging signals. The imaging signals may be employed with a scan converter for displaying a two-dimensional image corresponding to the image from which incident light falls on the array.

Other objects and advantages of the present invention will become apparent from the detailed description given hereinafter. It should be understood, however, that the detailed description and specific embodiments are given by way of illustration only since various changes and modifications within the spirit and scope of the invention will be apparent to those of skill in the art.

DETAILED DESCRIPTION OF PREFERRED EMBODIMENTS

Figure 1:
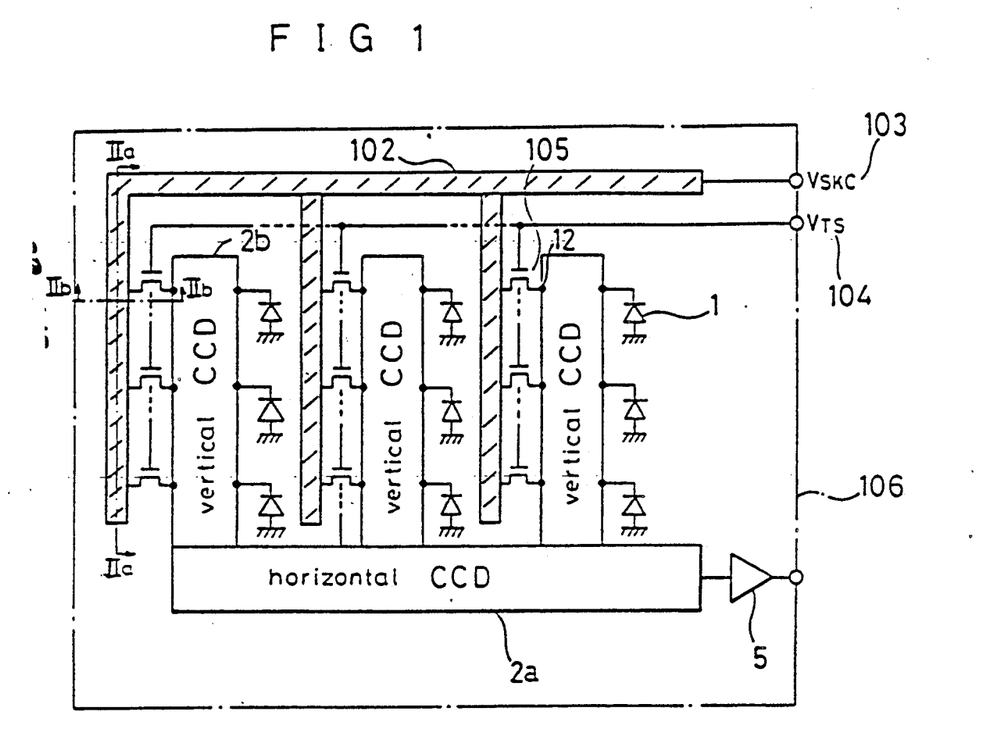
FIG. 1 is a schematic diagram of a solid state imaging array according to an embodiment of the invention.

FIG. 1 schematically shows a solid state imaging array 106 according to an embodiment of the present invention. Photoresponsive sensors in the form of photodiodes 1 are present for converting incident light into electrical charges. These photoresponsive sensors may respond to any portion of the visible or invisible light spectrum, but in one preferred application they are $Cd_{0.2}Hg_{0.8}Te$ sensors responsive to infrared light of about 10 microns in wavelength. The sensors 1 are arranged in an array corresponding to respective picture elements or pixels of a two-dimensional image. The light intensities forming that image are received and detected at each of the locations of a sensor 1 for the generation of electrical imaging signals that may be used to reconstruct a two-dimensional image, or may be stored, or further processed. For simplicity, FIG. 1 shows a 3×3 array, i.e., an array including three sensors in each of three rows. The invention is not limited to a particular size array and, for example, may be employed with a 128×128 array or with arrays containing a still larger number of sensors. It is not necessary that the array be square, i.e., contain the same number of sensors in each column as appear in each row, or even rectangular and may have other shapes. It is assumed, however, that the array includes a plurality of rows and columns.

Each of the sensors 1 in FIG. 1 supplies electrical charges generated in response to incident light through a respective signal processing circuit to one of the vertical CCDs 2b. The signal processing circuitry is of the type described with respect to FIGS. 11(a) to 11(c). The charges that pass through the signal processing circuitry are transferred by the vertical CCDs 2b to a horizontal CCD 2a that is commonly connected to all of the vertical CCDs 2b. As described with respect to FIG. 9, the transferred signals are collected in the horizontal CCD 2a and further transferred to an external device through the output circuit 5. Each of the vertical CCDs includes, for each respective sensor 1, a charge skimming electrode 12 to which a voltage is applied to determine the portion of the collected charge that is skimmed and further transferred to the respective vertical CCD 2b. The portion transferred depends on the magnitude of the skimming voltage as described above in relation to FIGS. 4(a) to 6(b) and 11(a) to 11(c).

Unlike the array described with respect to FIG. 7, each of the skimming electrodes 12 in FIG. 1 is not directly connected to an external terminal 19. Rather, a second CCD 102 including a single horizontal portion and a separate vertical portion for each of the corresponding vertical CCDs 2b is included. The second CCD 102 supplies, through an external terminal 103, skimming signals for applying skimming voltages of magnitudes chosen to compensate for variations in the photoresponse of the respective sensors 1 to the respective skimming electrodes. The CCDs 102 are connected to the respective skimming electrodes 12 when an appropriate gating voltage is applied to a terminal 104. That terminal 104 is electrically connected to each of the gates of a plurality of switching means 105. The gating voltage is applied through terminal 104 to actuate the switching means 105 and to connect the respective skimming signal, as a particular magnitude voltage, to the signal processing circuit for a respective sensor 1. The switching means 105 may include field effect transistors that are gated by a gating voltage applied to the terminal 104 in coordination with the application of the skimming signals sequentially to the terminal 103 of the array 106.

Figure 2A:
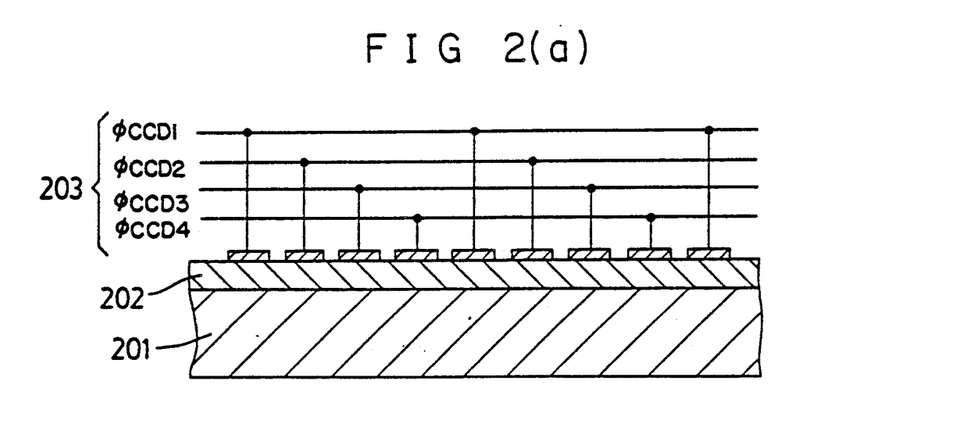
FIGS. 2(a) and 2(b) are sectional schematic views generally taken along lines IIa—IIa and IIb—IIb of FIG. 1, respectively, showing two aspects of the embodiment of FIG. 1.
Figure 2B:
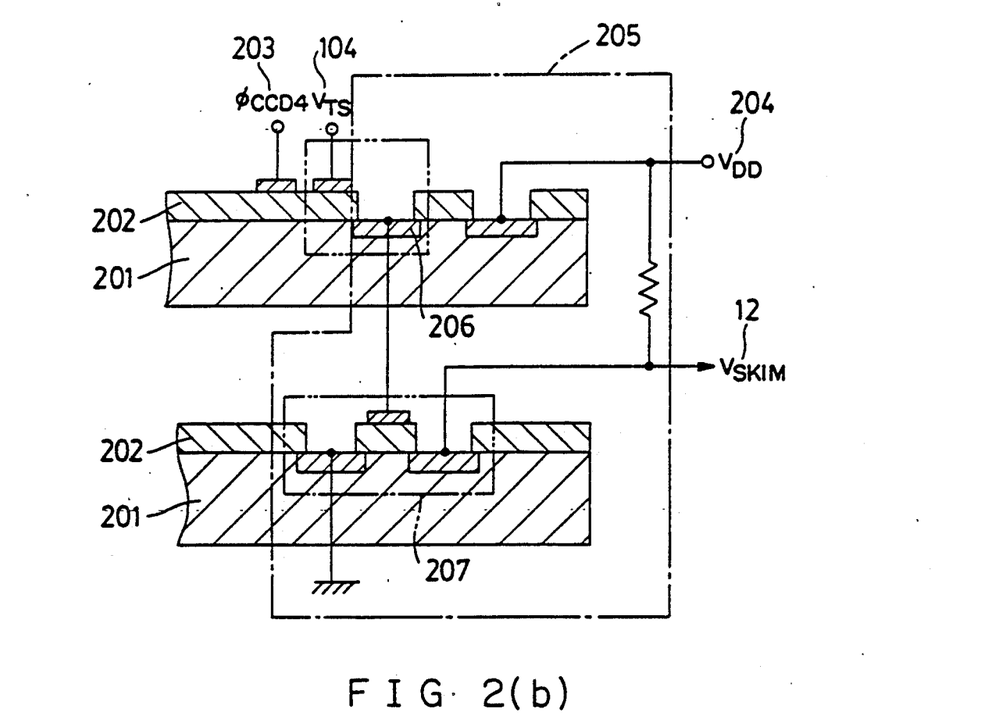

Particular structures of CCD 102 and of switching means 105 for receiving the skimming signals and for applying the skimming voltages to the skimming electrodes are shown in FIGS. 2(a) and 2(b). FIG. 2(a) is a sectional view of a conventional four phase CCD. That CCD construction is one example of an embodiment of a vertical portion of the CCD 102 taken along line IIa—IIa of FIG. 1. An insulator 202, such as silicon dioxide, which is disposed on substrate 201, such as silicon, forms, with the electrodes and interconnections 203, the four phase CCD. Although the CCD 102 is shown schematically as a continuous metallization in FIG. 1, as understood in the art it includes a plurality of mutually insulated electrodes that are connected in sequence according to the number of phases of the CCD. By applying signals of appropriate magnitudes in the appropriate sequence to the phases of the CCD, charge carriers, usually electrons, are transferred within the substrate 201 between positions opposite the CCD electrodes. This sequential transfer, as well understood in the art, steps appropriate voltages along the CCD from the input terminal 103 to a position opposite a desired electrode of the CCD.

FIG. 2(b) is a highly schematic, complex sectional view of a preferred embodiment of a switching means 105 for applying a particular magnitude of skimming voltage to a respective signal processing circuit when the desired skimming signal appears at the desired location along the CCD 102. That desired location, for this example, is indicated in the upper half of FIG. 2(b) by the electrode 203 which is the fourth phase of the four phase CCD. That electrode 203 is one of the electrodes appearing in the left-most vertical portion of CCD 102 in FIG. 1.

At the time when the desired skimming signal reaches the electrode 203, a gating signal is applied to the terminal 104. That gating signal actuates the switching means 105 by closing a switch, i.e., by lowering the potential barrier opposite electrode 104 of FIG. 2(b). The lowered barrier transfers the skimming signal from electrode 203 to a skimming voltage output circuit 205.

In the circuit 205, the skimming signal is converted into the desired skimming voltage magnitude and applied to the respective skimming electrode 12. The circuit 205 includes a conventional floating diffusion amplifier having an electrically floating diffusion region 206. That amplifier resembles a gateless FET in which the region 206 is the source. The corresponding drain region is connected to a terminal 204 of a power supply $V_{DD}$. The floating diffusion region 206 is electrically connected to the gate of an FET 207, such as a MOSFET. The source of transistor 207 is grounded and the drain is connected to the skimming electrode 12 as well as to the power supply terminal 204 through a load resistor.

The transfer of the desired skimming signal through the floating diffusion amplifier and the MOSFET 207 upon the application of the gating signal thus results in the application of a skimming voltage of desired magnitude to a respective charge skimming electrode. As is apparent from FIG. 2(b), each switching means 105, in a preferred embodiment, includes two elements, i.e., the floating diffusion amplifier and the MOSFET, that are commonly formed on and in substrate 201. In order to show both of those elements, two separated sectional view portion are shown in FIG. 2(b), although FIG. 1 indicates that FIG. 2(b) is taken only along a single section line.

From the foregoing description for supplying a respective skimming signal to a signal processing circuit for the respective sensor, it is apparent that the entire array can be similarly operated. A signal containing all of the desired skimming signals in sequence is applied to terminal 103 and transferred along CCD 102 until the appropriate alignment of the respective skimming signals and the signal processing circuits is achieved. At that time, the gating signal is applied to the terminal 104 and the skimmed electrical imaging signal from each of the sensors 1 is transferred to the respective vertical CCD 2b for subsequent sequential transfer to horizontal CCD 2a and, through output circuit 5, to external circuitry. In this structure and method of operation, the desired application of individual skimming voltage magnitudes to the respective skimming electrodes 12 to compensate for differences in the photosensitivities of the respective sensors 1 is achieved through only two external terminals, namely, the skimming terminal 103 and the gating terminal 104. Therefore, individual terminals electrically connected to each of the skimming electrodes are unnecessary.

Figure 3:
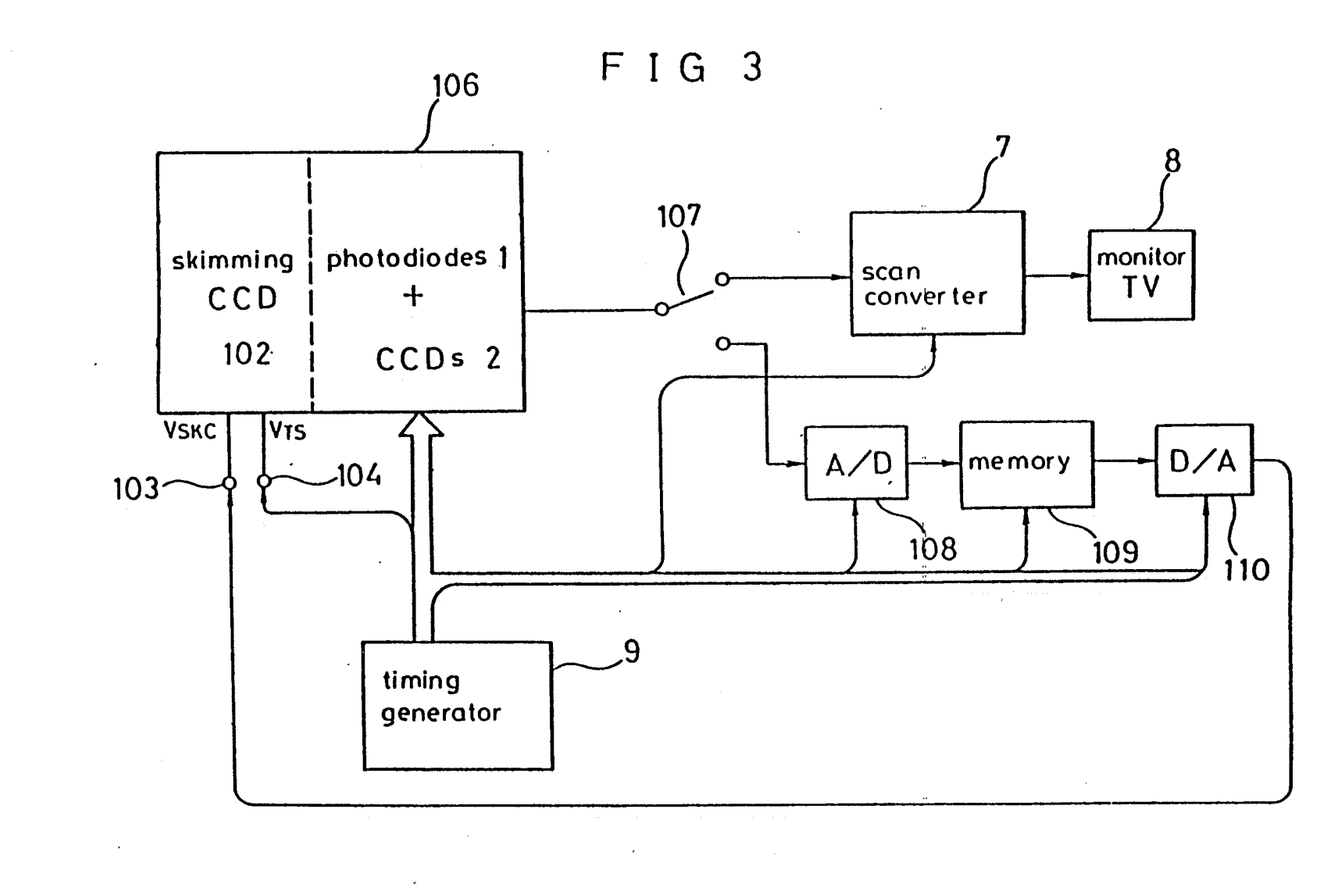
FIG. 3 is a schematic diagram of an embodiment of an imaging apparatus according to the invention.

FIG. 3 shows an imaging apparatus including the imaging array 106 that has been described above. The apparatus includes the scan converter 7, the television monitor 8, and the timing generator 9 as described with reference to FIG. 10. In addition to the connections shown in FIG. 10, the timing generator 9 also supplies the gating signal to the gating terminal 104 of the array. In addition to the components shown in FIG. 10, the apparatus of FIG. 3 includes a switch 107 for selectively supplying the electrical imaging signals either to the scan converter 7 or to an analog-to-digital converter 108. The analog-to-digital converter 108 receives the analog signals from the array 106 when the switch 107 is connected to the converter 108 and provides digital signals to a memory 109. The memory 109 stores those digital signals and provides them to a digital-to-analog converter 110. In the converter 110, the digital signals are converted back to analog form. The analog signals are the individual skimming signals for the array sensors 1. Those skimming signals are provided to the terminal 103 of the array 106 for transfer to the appropriate signal processing circuits through the CCD 102. The operations of the converters 108 and 110 and of the memory 109 must all be synchronized with other operations of the apparatus and, accordingly, each of them receives timing signals from the timing generator 9. The apparatus of FIG. 3 is employed both for calibrating, i.e. establishing, the skimming voltage magnitudes for each of the skimming electrodes to compensate for variations in the sensitivities of the sensors and for operation, i.e., forming an image, from the electrical imaging signals.

In order to calibrate the array, i.e., to establish skimming voltages for the respective skimming electrodes, the light incident on the array is controlled. The array may be illuminated with light of uniform intensity or, preferably, any light from an image to be formed is prevented from reaching the array while the expected background light is permitted to reach the array. That background light may vary in intensity over the area of the array. By using the background light to calibrate the array, variations in that background are incorporated into the skimming voltage magnitudes. Upon achievement of the controlled illumination, the array 106 is operated normally with a uniform skimming voltage applied to each of the skimming electrodes 12. That uniform skimming voltage is chosen like the level 18 in FIG. 5(a) so that some charge is generated even by the sensor producing the smallest quantity of charge, i.e., the least sensitive sensor. With the switch 107 connected to the analog-to-digital converter 108, the electrical imaging signals produced by the array 106 are transmitted to the converter 108. The converter 108 changes the received signals from analog form to digital form and provides that digital output in a sequence corresponding to the geometric arrangement of the sensors according to the driving scheme employed with the CCDs 2a and 2b. Those digital signals are stored in the memory 109 as the skimming levels for subsequent use in generating skimming voltages.

In the calibration sequence the uniform voltage applied to the skimming electrodes 12 may be zero. In that case, no signal is supplied to the CCD 102 through the terminal 103 and no gating signal is applied to the terminal 104. As a result, all the switching means 105 remain open so that no skimming voltage is applied to the individual skimming electrodes.

When the apparatus of FIG. 3 is operated to produce an image on the monitor 8, the stored digital skimming levels are converted into analog skimming signals in the digital-to-analog converter 110. The digital skimming levels are supplied in sequence from the memory 109 under the control of the timing generator 9 to the converter 110. As a result of the conversion, which also takes place sequentially under the control of the timing generator 9, a sequential analog signal containing the skimming signals for each individual signal processing circuit is supplied from the converter 110 through the skimming voltage terminal 103 to the CCD 102. Those skimming signals are sequentially transferred along the CCD 102 until located adjacent the respective signal processing circuits. At that time, the timing generator 9 produces a gating signal, supplied through the terminal 104, actuating the switching means 105, producing and applying the respective magnitude skimming voltages to the respective skimming electrodes 12. The skimmed stored charges are then transferred to the vertical CCDs 2b as the electrical imaging signals, incorporating compensation for the photoresponse characteristics of the respective sensors 1. Those electrical imaging signals are provided through the switch 107 to the scan converter 7 and the monitor 8 where an image is formed and displayed in the manner already described with respect to FIG. 10. As a result of the compensation for the particular photosensitivities of the sensors 1 and, depending upon the calibration conditions, for variations in the intensity of the background radiation over the area of the array, a high contrast, i.e., a high signal-to-noise ratio, sequence of electrical imaging signals from which a high quality image is formed is generated. While the apparatus of FIG. 3 is shown in a schematic block diagram configuration, it is apparent that many of the components shown there can be fabricated together in integrated circuits to simplify the actual apparatus.

The foregoing description has been concerned with the application of certain aspects of the invention to a solid state imaging array 106 that includes, in an assembly like that of FIG. 8, an array of photosensors and signal processing circuitry. Various aspects of the invention also are applicable to an array of photosensors for forming an image that need not have the electrical structure of the solid state imaging array 106 or the physical structure shown in FIG. 8.

Instead of the integrated signal processing circuitry described above, the array of photosensors may employ other circuitry configurations for generating electrical imaging signals in response to the electrical charges produced by the photosensors. Even with different circuitry and structure, the aspect of the invention concerning the adjustment of the electrical imaging signals to compensate for variations in the photosensitivities of the individual photosensors can be applied.

In applying that aspect of the invention, the array of photosensors for forming an image is first calibrated to determine the appropriate correction to compensate for variations in the photosensitivities of the photosensors. As described above for the solid state imaging array, each of the sensors is illuminated with a controlled quantity of incident light in the absence of light from an image. The array of photosensors may be illuminated with light of the uniform intensity or with a varying intensity according to various compensation schemes. If the intensity distribution of the background light is known, it may be desirable to directly employ that background light in order to compensate not only for varying sensitivities of the photosensors but also variations in the background light intensity. In response to that light, each sensor generates electrical charges which are transferred to external circuitry to produce correction signals. The more sensitive photosensors produce relatively large quantities of electrical charges, resulting in a relatively large correction signal for adjusting the quantity of electrical charge produced by the photosensor in response to incident light from both an image and background light. After the calibrating step, an image is formed from the electrical charges produced by the sensors in response to incident light from an image and background light. The charges generated by the respective photosensors are corrected by applying the respective correction signals, for example, by subtracting the correction signal intensity from the signal produced by the generated electrical charges. The remaining electrical charges represent the image including compensation for the varying sensitivities of the photosensors. Depending upon the calibration procedure, the background light effects may also be largely removed. The corrections may be applied in the course of sequentially storing the imaging signals, in sequentially reading stored image signals from a memory, or otherwise. It is not essential, however, that the correction be made directly within the solid state imaging array.

I claim:

1. A solid state imaging array for generating a plurality of electrical imaging signals comprising:
    a plurality of photoresponsive sensors for producing electrical charges in response to incident light;
    a signal processing circuit including a charge skimming electrode associated with each sensor for receiving and storing electrical charges from the associated sensor and for transferring to a respective charge coupled device a skimmed portion of the stored electrical charge, the skimmed portion being determined by the magnitude of a skimming voltage applied to the respective skimming electrode;
    a plurality of first charge coupled devices for receiving the skimmed portions of electrical charges from the signal processing circuits and for transferring the skimmed portions of electrical charges to external circuitry; and
    means for applying different magnitude skimming voltages to each of the skimming electrodes, thereby compensating for variations in the photosensitivities of the individual sensors.

2. The solid state imaging array of claim 1 wherein said means for applying the skimming voltages to respective skimming electrodes comprises:
    switching means associated with each of the signal processing circuits receiving skimming signals for converting the skimming signals into the skimming voltage magnitudes and for controlling the application of a skimming voltage magnitudes to the respective skimming electrodes; and
    a second charge coupled device for supplying the associated skimming signals to the respective switching means.

3. The solid state imaging array of claim 2 including means for supplying a gating signal for actuating the switching means and transferring the associated skimming voltage magnitudes to the respective skimming electrodes.

4. The solid state imaging array of claim 2 wherein said each switching means comprises a floating diffusion region amplifier receiving the respective skimming signal for the associated signal processing circuit from the second charge coupled device and a field effect transistor having a grounded source, a gate receiving the output signal from the floating diffusion region amplifier, and a drain supplying the skimming voltage magnitude to the respective skimming electrode.

5. The solid state imaging array of claim 1 wherein said sensors are responsive to infrared light.

6. The solid state imaging array of claim 5 wherein said sensors are $Cd_{0.2}Hg_{0.8}Te$.

7. A solid state imaging apparatus for generating a plurality of electrical imaging signals comprising:
    a plurality of photoresponsive sensors for producing electrical charges in response to incident light;
    a signal processing circuit including a charge skimming electrode associated with each sensor for receiving and storing electrical charges from the associated sensor and for transferring to a respective charge coupled device a skimmed portion of the stored electrical charge, the skimmed portion being determined by the magnitude of a skimming voltage applied to the respective skimming electrode;
    a plurality of first charge coupled devices for receiving the skimmed portions of electrical charges from the signal processing circuits and for transferring the skimmed portions of electrical charges to external circuitry;
    means for applying different magnitude skimming voltages to each of the skimming electrodes, thereby compensating for variations in the photosensitivities of the individual sensors;
    memory means for storing skimming levels corresponding to the magnitudes of the skimming voltages to be applied to the respective skimming electrodes; and
    means for converting the stored skimming levels into skimming voltage magnitudes and for applying the skimming voltage magnitudes to the respective skimming electrodes.

8. The solid state imaging apparatus of claim 7 wherein said means for applying the skimming voltages to the respective skimming electrodes comprises:
    switching means associated with each of the signal processing circuits receiving the skimming signals for converting the skimming signals into the skimming voltage magnitudes and for controlling the application of a skimming voltage magnitudes to the respective skimming electrodes; and
    a second charge coupled device for supplying the associated skimming signals to the respective switching means.

9. The solid state imaging apparatus of claim 8 including means for supplying a gating signal for actuating the switching means and transferring the associated skimming voltage magnitudes to the respective skimming electrodes.

10. The solid state imaging apparatus of claim 9 wherein said means for converting comprises a digital-to-analog converter connected to the second charge coupled device for converting stored levels into the respective skimming signals; and clock means for producing a gating signal for actuating the switching means to apply the associated skimming voltage magnitudes to the respective skimming electrodes.

11. The solid state imaging apparatus of claim 7 including:
means for producing skimming levels for storage in the memory means comprising an analog-to-digital converter for receiving electrical charges transferred from the first charge coupled device for each signal processing circuit with a uniform voltage applied to the skimming electrodes and a controlled quantity of light incident on each sensor and for converting the quantities of charge received into digital values, establishing the levels of the respective skimming signals and corresponding skimming voltages.

12. The solid state imaging apparatus of claim 7 wherein said sensors are responsive to infrared light.

13. The solid state imaging apparatus of claim 12 wherein said sensors are $Cd_{0.2}Hg_{0.8}Te$.

14. The solid state imaging apparatus of claim 7 wherein each switching means comprises a floating diffusion region amplifier receiving the respective skimming signal for the associated signal processing circuit from the second charge coupled device and a field effect transistor having a grounded source, a gate receiving the output signal from the floating diffusion region amplifier, and a drain supplying the skimming voltage magnitude to the respective skimming electrode.

15. A method of calibrating a solid state imaging apparatus that includes a plurality of photoresponsive sensors that produce electrical charges in response to incident light, a signal processing circuit including a charge skimming electrode associated with each sensor for receiving and storing electrical charges from the associated sensor and for transferring to a respective charge coupled device a skimmed portion of the stored electrical charge, the skimmed portion being determined by the magnitude of a skimming voltage applied to the skimming electrode comprising:
illuminating each of the sensors with a controlled quantity of incident light;
applying a uniform magnitude skimming voltage to each of the skimming electrodes; and
transferring the electrical charges produced by the respective signal processing circuits to establish the respective skimming levels.

16. The method of claim 15 wherein all of the sensors are illuminated with light of the same intensity.

17. The method of claim 15 wherein the sensors are illuminated with light having an intensity corresponding to the intensity of background light incident on the array when no light from an image source is present.

18. The method of claim 15 including at least one of applying zero voltage as the uniform magnitude skimming voltage to each of the skimming electrodes and keeping the switching means open during calibration of the apparatus.

19. A method of forming an image of a source emitting light with a solid state imaging array including a plurality of photoresponsive sensors that produce electrical charges in response to incident light, a signal processing circuit including a charge skimming electrode associated with each sensor for receiving and storing electrical charges from the associated sensor and for transferring to a respective charge coupled device a skimmed portion of the stored electrical charge, the skimmed portion being determined by the magnitude of a skimming voltage applied to the skimming electrode comprising:
calibrating the array to determine the magnitudes of skimming voltages to be applied to the skimming electrodes to compensate variations in photosensitivities of the sensors, applying the calibrated skimming voltages to the skimming electrodes of the respective signal processing circuits to skim electrical charges produced by the sensors in response to incident light from a source emitting light, illuminating the array with light from an image source and background light to generate electrical charges, skimming the electrical charges in accordance with the respective skimming voltages, and transferring the skimmed charges in sequence.

20. The method of claim 19 including reconstructing the image by scanning the skimmed electrical charges in correspondence to the geometrical arrangement of the sensors in the array.

21. The method of claim 19 including forming an image of a source radiating infrared light.

* * * * *